(12) United States Patent
Ueda et al.

(10) Patent No.: US 7,826,512 B2
(45) Date of Patent: Nov. 2, 2010

(54) SEMICONDUCTOR LASER DEVICE INCLUDING TRANSPARENT ELECTRODE

(75) Inventors: Tetsuzo Ueda, Osaka (JP); Masaaki Yuri, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/850,603

(22) Filed: Sep. 5, 2007

(65) Prior Publication Data

US 2008/0008220 A1 Jan. 10, 2008

Related U.S. Application Data

(63) Continuation of application No. 11/109,787, filed on Apr. 20, 2005, now Pat. No. 7,279,751.

(30) Foreign Application Priority Data

Jun. 21, 2004 (JP) .............................. 2004-182651

(51) Int. Cl.
*H01S 5/00* (2006.01)
*H01S 3/097* (2006.01)
(52) U.S. Cl. ..................................... 372/87; 372/46.01
(58) Field of Classification Search .................... 372/87, 372/46.01
See application file for complete search history.

(56) References Cited

U.S. PATENT DOCUMENTS 5,567,960 A * 10/1996 Ishibashi et al. ............ 257/103
6,335,231 B1   1/2002 Yamazaki et al.
2001/0042860 A1 * 11/2001 Hata et al. .................... 257/21
2003/0052326 A1   3/2003 Ueda et al.
2004/0184497 A1   9/2004 Kneissl et al.

FOREIGN PATENT DOCUMENTS

JP         8-97507          4/1996

OTHER PUBLICATIONS

English Language Abstract of JP 8-97507.
S. Nakamura et al., "the Blue Laser Diode", Springer-Verlag Berlin Heidelberg New York, pp. 254-259 (1997).

* cited by examiner

*Primary Examiner*—Minsun Harvey
*Assistant Examiner*—Marcia A. Golub-Miller
(74) *Attorney, Agent, or Firm*—Greenblum & Bernstein, P.L.C.

(57) ABSTRACT

It is an object of the present invention to provide a semiconductor laser device with high-yielding in which a clack generated in an epitaxial growth layer is restrained and to the manufacturing method thereof, the semiconductor laser device includes a GaN substrate 1, an n-type GaN layer 2, an n-type AlGaN cladding layer 3, a n-type GaN guide layer 4, an InGaN multiple quantum well active layer 5, an undoped-GaN guide layer 6, a p-type AlGaN electron overflow suppression layer 7, a p-type GaN guide layer 8, a SiO$_2$ blocking layer 9, an Ni/ITO cladding layer electrode 10 as a transparent electrode, a Ti/Au pad electrode 11, and a Ti/Al/Ni/Au electrode 12. The SiO$_2$ blocking layer 9 is formed above the InGaN multiple quantum well active layer 5 so as to have an opening. The Ni/ITO cladding layer electrode 10 is formed inside the opening, and which is transparent for the light from the InGaN multiple quantum well active layer, and serves as a cladding layer.

10 Claims, 8 Drawing Sheets

"PRIOR ART"

SEMICONDUCTOR LASER DEVICE INCLUDING TRANSPARENT ELECTRODE

CROSS-REFERENCE TO RELATED APPLICATIONS

This application is a continuation of application Ser. No. 11/109,787, filed Apr. 20, 2005, the disclosure of which is expressly incorporated by reference herein in its entirety.

This application also claims priority of Japanese Application No. 2004-182651, filed Jun. 21, 2004, the disclosure of which is expressly incorporated by reference herein its entirety.

BACKGROUND OF THE INVENTION (1) Field of the Invention

The present invention relates to a semiconductor laser device applicable to a blue-violet semiconductor laser device used for, for example, a light source for writing and reading of a high density optical disc, and a manufacturing method thereof.

(2) Description of the Related Art

A III-V group nitride semiconductor (hereafter referred to as InGaAlN) represented by GaN has been focused as a material which has a large band gap (3.4 eV for GaN in room temperature) and can realize a device which emits light in a wave range from green to ultraviolet light. By now, a green/blue light-emitting diode using the InGaAlN has been commercially manufactured and available for various displays, traffic signals and the like. Also, a white light-emitting diode which emits white light by exciting a phosphor using a blue light-emitting diode and an ultraviolet light-emitting diode has been commercially manufactured and used for liquid crystal back light and the like. As a field of application of the InGaAlN next to the light-emitting diode, a blue-violet semiconductor laser device which is applicable to a light source for a next-generation high density optical disc is given with expectation. It is necessary for its practical use to realize high-output and long-lived blue-violet semiconductor laser device in order to deal with high-speed writing. Through seduction of crystal defect along with development of epitaxial growth technology and higher performance along with improvement of device structure, they have reached a nearly satisfied level for the use of the next generation optical disc. From now on, it is necessary to develop a blue-violet semiconductor laser device which can satisfy an output specification and can be manufactured for mass production with high yield and with low costs.

Hereafter, it is explained about a structure of a high-output blue-violet semiconductor laser device which has been reported.

FIG. 1 is a schematic cross-section showing a structure of a conventional GaN-based blue-violet semiconductor laser device (e.g. S. Nakamura et. al., "The Blue Laser Diode", Springer-Verlag Berlin Heidelberg New York: pp. 255).

The blue-violet semiconductor laser device has an n-type GaN layer 2, an n-type AlGaN cladding layer 3, an n-type GaN guide layer 4, an InGaN multiple quantum well active layer 5, an undoped-GaN guide layer 6, a p-type AlGaN electron overflow suppression layer 7, a Ti/Au pad electrode 11, a Ti/Al/Ni/Au electrode 12, a sapphire substrate 13, a Ni/Au electrode 19, a p-type AlGaN cladding layer 20, a p-type GaN contact layer 21, and $SiO_2$ passivation film 22.

The following layers are sequentially formed on the sapphire substrate 13 by an epitaxial growth technique using, for example, a Metal Organic Chemical Vapor Deposition (MOCVD technique) and the like: the n-type GaN layer 2; the n-type AlGaN cladding layer 3; the n-type GaN guide layer 4; the InGaN multiple-quantum well active layer 5; the undoped-GaN guide layer 6; the p-type AlGaN electron overflow suppression layer 7; the p-type AlGaN cladding layer 20; and the p-type GaN contact layer 21.

The portions of the p-type AlGaN cladding layer 20 and the p-type GaN contact layer 21 are etched so as to form a striped ridge portion. The $SiO_2$ passivation film 22 is formed so as to cover sidewalls of the ridge portion. On the top of the ridge portion, there is an opening in the $SiO_2$ passivation film 22, and the Ni/Au electrode 19 and the Ti/Au pad electrode 11 are formed as a p-type side ohmic electrode in the opening. Herein, a portion of the epitaxial growth layer is etched so as to expose the n-type GaN layer 2, and the Ti/Al/Ni/Au electrode 12 is formed as an n-type side ohmic electrode on the exposed n-type GaN layer 2.

In the blue-violet semiconductor laser device having the above mentioned structure, the striped ridge structure serves as a waveguide of the semiconductor laser device, light emission of 405 nm from the InGaN multiple quantum well active layer 5 is confined inside the ridge because of a difference of the refractive indexes between the p-type AlGaN cladding layer 20 and the $SiO_2$ passivation film 22. Thus, a blue-violet laser is realized by so-called ridge waveguide structure.

SUMMARY OF THE INVENTION

By the way, in the semiconductor laser device having a conventional ridge structure shown in FIG. 1 and the manufacturing method thereof, for the purpose of sufficiently increasing a value of a confinement coefficient of light in a direction perpendicular to the active layer, it is necessary to form a cladding layer specifically with total of around 1.5 µm by making the thicknesses of the n-type cladding layer and the p-type cladding layer respectively 1 µm and 0.5 µm in the case of the AlGaN with Al composition of 7 percent. However, in the epitaxial growth layer of the conventional semiconductor laser device, lattice-mismatching in the n-type GaN layer with the sapphire substrate is sufficiently relaxed, and the AlGaN layer formed on the n-type GaN layer epitaxially grows having crystal strain to keep the lattice-matching with the underlying GaN layer. Since the AlGaN has a smaller lattice constant compared to the GaN, the AlGaN layer is grown having a tensile strain. Therefore, it is likely to generate a crack in the AlGaN layer during or after the crystal growth. The crack is more likely to be generated if the Al composition of the AlGaN layer is larger or if the AlGaN layer is thicker. Accordingly, as a method of controlling the crack, methods of reducing the Al composition or of making the film thinner are suggested. However, in order to obtain sufficient light confined in a vertical direction in the semiconductor laser device, the 7 percent of the Al composition and the thickness of around 1.5 µm are necessary as described in the above. Therefore, the methods cannot control the crack of the AlGaN layer. Also, in order to realize the low threshold current, it is necessary to position the peak of the light distribution at the light-generating active layer. Therefore, the thickness of the p-type cladding layer cannot be 0.5 µm or thinner so that the methods cannot control the crack of the AlGaN layer.

Further, in the case where the AlGaN is epitaxially grown by the commonly used MOCVD technique, because of a chemical vapor deposition between, for example, an Al source such as Tri-Methyl Aluminum (TMA) and an N source such as $NH_3$, it is difficult to obtain sufficient epitaxial growth-rate. For example, it is very difficult to obtain a rate of 1 μm/hour and more. As the result, a growth rate of the epitaxial growth for forming a semiconductor layer including a large amount of AlGaN is decreased so that the conventional laser device in which the AlGaN layer serves as a cladding layer causes high costs due to the long live of the epitaxial growth.

Accordingly, considering the mentioned problems, the first object of the present invention is to provide a high-yield semiconductor laser device in which the crack generated in the epitaxial growth layer is controlled, and to provide a manufacturing thereof.

In addition, the second object of the present invention is to provide a low cost semiconductor laser device in which the epitaxial growth time is shortened, and to provide the method thereof.

In order to achieve the objectives, a semiconductor laser device according to the present invention comprises: a light-emitting layer which is made of a semiconductor; a current-blocking layer which is formed above said light-emitting layer so as to have an opening, and which is composed of a first dielectric; and a transparent electrode which is formed inside the opening, and which is transparent for light emitted from said light-emitting layer, and serves as a cladding layer.

With this structure, in the semiconductor laser structure, the cladding layer can be formed by the transparent electrode instead of the epitaxial growth layer so that the AlGaN layer among the expitaxial growth layers can be thinner. Therefore, stress in the layer is reduced and the clack generated during or after the epitaxial growth can be reduced. As the result, it is unlikely to be affected by the crack generated in the AlGaN layer so that the semiconductor laser device with high yielding can be realized. At the same time, the epitaxial growth layer, in particular, the AlGaN layer which has slow growth rate and requires long time to grow becomes thinner so that crystal growth time is shortened and the manufacturing cost is reduced.

Here, said transparent electrode is made of a conductive oxide, and may have a refractive index which is higher than a refractive index of said current-blocking layer and smaller than a refractive index of said light-emitting layer.

With this structure, in the semiconductor laser structure, the cladding layer can be formed by the conductive oxide instead of the epitaxial growth layer so that the AlGaN layer among the expitaxial growth layers can be thinner. Therefore, stress in the layer is reduced and the clack generated during or after the epitaxial growth can be reduced. As the result, the semiconductor laser device with high yielding can be realized. At the same time, crystal growth can be performed in a short time so that a low-cost semiconductor laser device can be realized.

Also, the conductive oxide may be one of indium oxide doped with tin, tin oxide doped with antimony, and zinc oxide.

With this structure, the refractive index of the transparent electrode becomes higher than the refractive index of dielectric such as $SiO_2$ and SiN, and the resistivity is $10^{-3}$ Ωcm and less. Therefore, the transparent electrode can be functioned as a waveguide and an electrode and the low-cost semiconductor laser device with high yielding can be realized.

Further, the semiconductor laser device further comprises a dielectric layer which is formed inside the opening, and which is made of a second dielectric, wherein said dielectric layer is formed above said light-emitting layer so as to have said transparent electrode in between, and which may have a refractive index that is higher than a refractive index of said current-blocking layer and smaller than a refractive index of said light-emitting layer.

With this structure, in the semiconductor laser structure, the cladding layer can be formed by a thin transparent electrode and a dielectric layer with high refractive index instead of the epitaxial growth layer so that the AlGaN layer among the expitaxial growth layers can be thinner. Therefore, stress in the layer is reduced and the clack generated during or after the epitaxial growth can be reduced. As the result, the semiconductor laser device with high yielding can be realized. At the same time, crystal growth can be performed in a short time so that a low-cost semiconductor laser device can be also realized. Further, the dielectric layer with high refractive index can serve as a waveguide so that absorption in the waveguide is reduced. As the result, a high-output semiconductor laser device can be realized.

Further, the second dielectric may be one of SiN, $Nb_2O_5$, $ZrO_2$, $TiO_2$ and $Ta_2O_5$.

With this structure, the dielectric film having a same refractive index can be formed with a good reproducibility by a vapor phase deposition method, a spattering method and the like. Therefore, the low-cost semiconductor laser device with high yielding can be realized.

In addition, the semiconductor laser device may further comprise a p-type light-guiding layer which is made of a semiconductor, and which is formed between said light-emitting layer and said current-blocking layer so as to contact with said transparent electrode.

With this structure, an ohmic contact with the transparent electrode can be reserved. Therefore, a semiconductor laser device with small series resistance and series voltage can be realized. For example, it is possible to have a resistivity of less 1 Ωcm and less.

Further, an impurity concentration of said light-guiding layer may increase in a direction from said light-emitting layer to said transparent electrode.

With this structure, the contact resistance of the transparent electrode with the light guide layer can be reduced. Therefore, a semiconductor laser device with smaller series resistance and series voltage can be realized.

Furthermore, said light-guiding layer may be made of a semiconductor doped with Mg.

With this structure, the contact resistance with the transparent electrode can be reduced using a p-type GaN semiconductor having a higher carrier concentration as a p-type guiding layer. Therefore, a semiconductor laser device with small series resistance and series voltage can be realized.

Further, the semiconductor laser device further comprises: a metal film formed above said transparent electrode; and a first substrate formed above said metal film, wherein said first substrate may have a cleavage plane perpendicular to a direction along a waveguide of said semiconductor laser device.

With this structure, the cleavage plane can be produced for the transparent electrode which is generally has poor cleavage, together with the substrate. Therefore, a semiconductor laser device having a high refractivity against a resonator mirror and having low threshold current and low operating current can be realized.

Further, said metal film may include at least one of Au and AuSn.

With this structure, different types of substrates can be bonded by heating the metal film and eutectic bonding. For example, a transfer to a substrate with good thermal condition or a substrate with good cleavage is possible. Therefore, a long-lived semiconductor laser device with low threshold current can be realized.

Furthermore, said first substrate may be made of one of Si, GaAs, InP and SiC.

With this structure, the substrate to be bonded is a substrate with good crystalline and cleavage. Therefore, a long-lived semiconductor laser device with low threshold current can be realized.

Further, the cleavage plane of said first substrate may be parallel to a <110> direction or a <1-100> direction.

With this structure, flatness of the cleavage plane is improved so that the semiconductor laser device with low threshold current can be realized.

Furthermore, said light-emitting layer may be made of a compound semiconductor including nitrogen.

With this structure, the clack generated during or after epitaxial growth can be controlled. Therefore, a blue-violet semiconductor laser device with high yielding can be realized. In addition, the crystal growth can be performed in a shorter time period so that a low-cost blue-violet semiconductor laser device can be realized.

Further, the semiconductor laser device further comprises a second substrate on which said light-emitting layer is formed, wherein said second substrate may be made of one of sapphire, SiC, GaN, AlN, MgO, LiGaO$_2$ and LiAlO$_2$.

With this structure, an epitaxial growth layer with good crystalline can be formed on the substrate. Therefore, a semiconductor laser device with low threshold current and low operating current can be realized.

Further, said first dielectric may be one of SiO$_2$, SiN, Nb$_2$O$_5$, ZrO$_2$ and Ta$_2$O$_5$.

With this structure, the dielectric film having a same refractive index can be formed with a good reproducibility by a vapor phase deposition method, a spattering method and the like. Therefore, the low-cost semiconductor laser device with high yielding can be realized.

Furthermore, said transparent electrode may include Ni.

With this structure, a transparent electrode is formed with, for example, Ni/ITO or Ni/Au and the like, and the contact resistance with light guide layer composed of GaN can be reduced. Therefore, a semiconductor laser device with small series resistance and low operating current can be realized.

Also, the present invention can have a method of manufacturing a semiconductor laser device, said method comprising: forming a light-emitting layer made of a semiconductor on a first substrate; forming a current-blocking layer made of a first dielectric, above the light-emitting layer; forming an opening in the current-blocking layer; and forming a transparent electrode inside the opening, the transparent electrode being transparent for light emitted from the light-emitting layer, and serving as a cladding layer.

With this structure, in the semiconductor laser structure, the cladding layer can be formed by the transparent electrode instead of the epitaxial growth layer so that the AlGaN layer among the expitaxial growth layers can be thinner. Therefore, stress in the layer is reduced and the clack generated during or after the epitaxial growth can be reduced. As the result, it is unlikely to be affected by the crack generated in the AlGaN layer so that the semiconductor laser device with high yielding can be realized. At the same time, the epitaxial growth layer, in particular, the AlGaN layer which has slow growth rate and requires long time to grow becomes thinner so that crystal growth time is shortened and the manufacturing cost is reduced.

Here, said forming of the transparent electrode may comprise forming the transparent electrode which is made of a conductive oxide, and has a refractive index which is higher than a refractive index of the current-blocking layer and smaller than a refractive index of the light-emitting layer.

With this structure, in the semiconductor laser structure, the cladding layer can be formed by the conductive oxide instead of the epitaxial growth layer so that the AlGaN layer among the expitaxial growth layers can be thinner. Therefore, stress in the layer is reduced and the clack generated during or after the epitaxial growth can be reduced. As the result, the semiconductor laser device with high yielding can be realized. At the same time, crystal growth can be performed in a short time so that a low-cost semiconductor laser device can be realized.

Further, the method of manufacturing the semiconductor laser device further comprises forming a dielectric layer inside the opening, the dielectric layer being made of a second dielectric having a refractive index which is higher than a refractive index of the current-blocking layer and smaller than a refractive index of the light-emitting layer, wherein said forming of the dielectric layer may comprise forming the dielectric layer above the light-emitting layer so as to have the transparent electrode in between.

With this structure, in the semiconductor laser structure, the cladding layer can be formed by a thin transparent electrode and a dielectric layer with high refractive index instead of the epitaxial growth layer so that the AlGaN layer among the expitaxial growth layers can be thinner. Therefore, stress in the layer is reduced and the clack generated during or after the epitaxial growth can be reduced. As the result, the semiconductor laser device with high yielding can be realized. At the same time, crystal growth can be performed in a short time so that a low-cost semiconductor laser device can be also realized. Further, the dielectric layer with high refractive index can serve as a waveguide so that absorption in the waveguide is reduced. As the result, a high-output semiconductor laser device can be realized.

In addition, the method of manufacturing the semiconductor laser device further comprises: forming a first metal film above the transparent electrode; forming a second metal film above a second substrate; compressing and bonding the first metal film and the second metal film; and removing the first substrate, wherein said compressing and bonding may comprise compressing and bonding the first metal film and the second metal film so as to make a direction along with a waveguide of the semiconductor laser device perpendicular to a cleavage plane of the second substrate.

With this structure, a transfer to, for example, a substrate with good thermal condition or to a substrate with good cleavage is possible by bonding different substrates, for example, with heating and eutectic crystal bonding after the first metal film and the second metal film are compressed and bonded, and further by separating the substrates. Therefore, a long-lived semiconductor laser device with low threshold current can be realized.

Further, said removing may comprise removing the first substrate by separating the first substrate from the semiconductor laser device by irradiating light from a backside of the first substrate on which the active layer is not formed.

With this structure, a large-area substrate can be separated with good reproducibility. Therefore, even in the case where it is difficult to separate the substrate by polishing, a method of manufacturing a semiconductor laser device which can easily separate the substrate can be realized.

Further, said removing may comprise irradiating the light using pulsed oscillation laser as a light source.

With this structure, light output power used for substrate separation can be increased. Therefore, a method of manufacturing a semiconductor laser device which can further easily separate the substrate can be realized.

Further, said removing may comprise irradiating the light using a line of a mercury lamp as a light source.

With this structure, a spotted size of light used for the substrate separation can be enlarged. Therefore, a method of manufacturing a semiconductor laser device which can shorten the time necessary for the substrate separation can be realized.

Further, said removing may comprise irradiating the light so as to scan the backside of the first substrate.

With this structure, a large-area substrate can be separated without being affected by a beam size of a light source of light used for the substrate separation. Therefore, a method of manufacturing a semiconductor laser device which can easily separate the substrate can be realized.

Furthermore, said removing may comprise removing the first substrate by polishing the first substrate.

With this structure, a method of manufacturing a semiconductor laser device which can separate a large-area substrate with low cost can be realized.

Further, said forming of the first metal film or said forming of the second metal film may comprise forming the first metal film or the second metal film including at least one of Au and AuSn.

With this structure, different types of substrates can be bonded by heating the metal film and eutectic bonding. For example, a transfer to a substrate with good thermal condition or a substrate with good cleavage is possible. Therefore, a long-lived semiconductor laser device with low threshold current can be realized.

Further, said forming of the second metal film may comprise forming the second metal film on the second substrate made of one of Si, GaAs, InP and SiC.

With this structure, the substrate to be bonded is a substrate with good crystalline and cleavage. Therefore, a long-lived semiconductor laser device with low threshold current can be realized.

Furthermore, said compressing and bonding may comprise compressing and bonding the first metal film and the second metal film so as to make the direction along the waveguide of the semiconductor laser device parallel to a <110> direction or a <1-100> direction.

With this structure, flatness of the cleavage plane is improved so that the semiconductor laser device with low threshold current can be realized.

Further, said forming of the light-emitting layer may comprise forming the light-emitting layer made of a compound semiconductor including nitrogen With this structure, the clack generated during or after epitaxial growth can be controlled. Therefore, a blue-violet semiconductor laser device with high yielding can be realized. In addition, the crystal growth can be performed in a shorter time period so that a low-cost semiconductor laser device can be realized.

Furthermore, said forming of the light-emitting layer may comprise forming the light-emitting layer on a first substrate made of one of sapphire, SiC, GaN, AlN, MgO, $LiGaO_2$ and $LiAlO_2$.

With this structure, an epitaxial growth layer with good crystalline can be formed on the substrate. Therefore, a semiconductor laser device with low threshold current and low operating current can be realized.

As is clear from the above explanation, according to a semiconductor laser device and the method thereof by the present invention, a semiconductor laser device with high yielding can be realized. In addition, the following semiconductor laser devices can be realized: a low cost semiconductor laser device; a semiconductor laser device of low operating current; a high-output semiconductor laser device; a semiconductor laser device for low threshold current and low operating current; and a long-lived semiconductor laser device.

In addition, a design margin for following uses can be enlarged: for restraining a generation of a kink in the current-light output characteristics when the high output operation is performed; and for obtaining a stable single horizontal mode high-output laser device. Also, by precisely controlling the difference of the refractive indexes, the design margin in a structural design of a low noise laser device in a self-oscillation type can be enlarged. Further, an interface resistance in a re-grown portion can be smaller and an electrode area on the p-type GaN layer can be bigger. Therefore, a semiconductor laser device of low-operating voltage with small series resistance can be realized. Furthermore, assuming that an n-type AlGaN layer is formed under the n-type GaN cladding layer and the refractive index difference is further set in the cladding layer, it is possible to have a structural design by which light confinement coefficient Tv in a direction perpendicular to the active layer to be held high and a vertical divergence angle θv to be small. Therefore, a semiconductor laser device with characteristic of high beam usage efficiency in a use of an optical disc for a low threshold current can be realized.

For further information about technical background to this application, the disclosure of Japanese Patent Application No. 2004-182651 filed on Jun. 21, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Hereafter, it is explained about a semiconductor laser device and a manufacturing method thereof according to embodiments of the present invention.

First Embodiment

Figure 1:
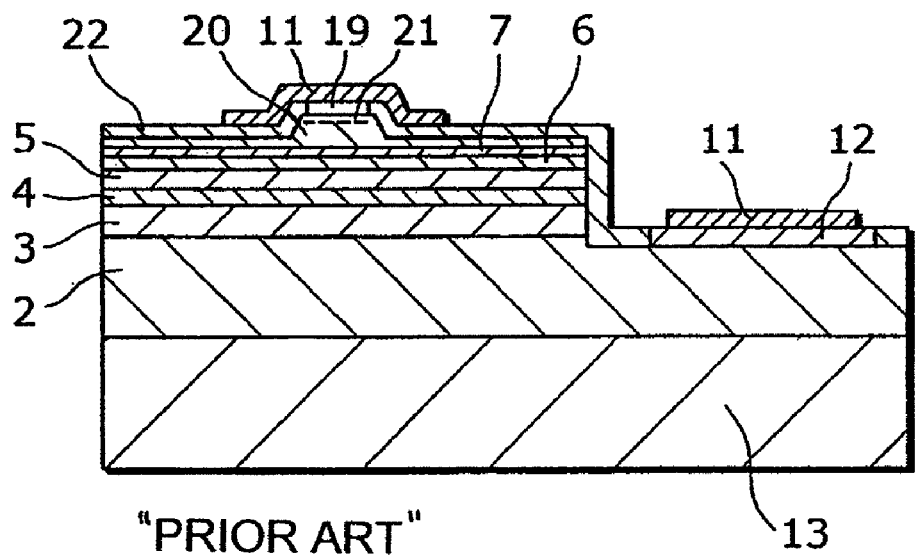
FIG. 1 is a schematic cross-section showing a structure of a conventional blue-violet semiconductor laser device.
Figure 2:
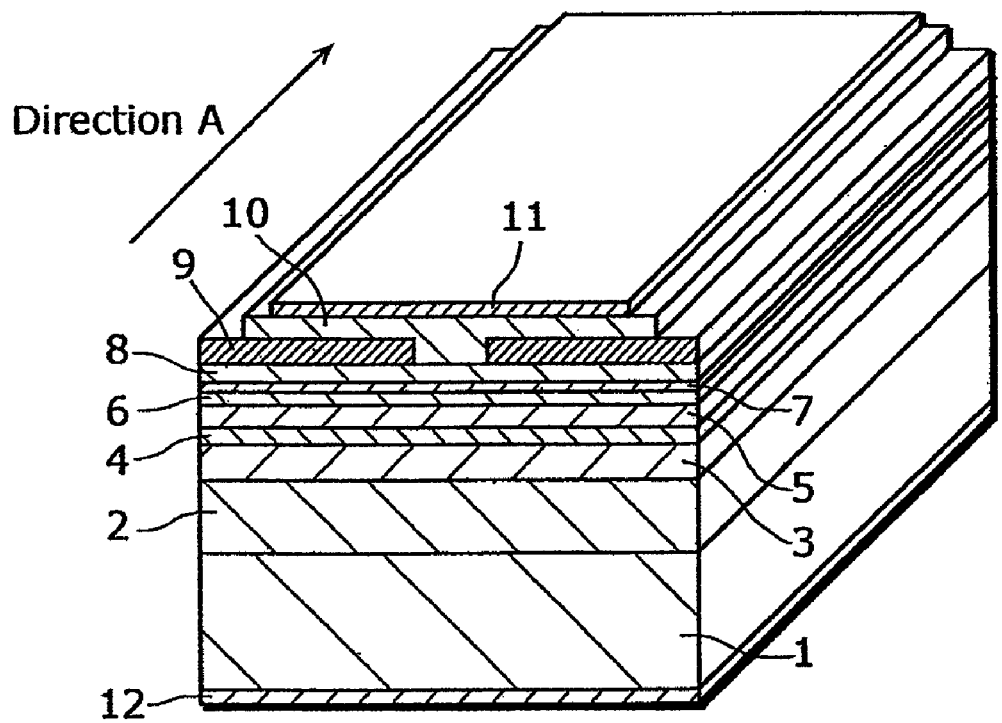
FIG. 2 is a perspective view showing a structure of a blue-violet semiconductor laser device according to a first embodiment of the present invention.

FIG. 2 is a perspective view showing a structure of a blue-violet semiconductor laser device in a first embodiment.

The semiconductor laser device has a GaN substrate 1, an n-type GaN layer 2, an n-type AlGaN cladding layer 3, an n-type GaN guide layer 4, an InGaN multiple quantum well active layer 5 as a light-emitting layer, an undoped-GaN guide layer 6, a p-type AlGaN electron overflow suppression layer 7, a p-type GaN guide layer 8 as a light guide layer, an SiO$_2$ blocking layer 9 as a current confinement layer, an Ni/ITO cladding layer electrode 10 as a transparent electrode, a Ti/Au pad electrode 11 and a Ti/Al/Ni/Au electrode 12.

The following layers are sequentially formed on the GaN substrate 1 by an epitaxial growth technique using, for example, a MOCVD technique and the like: the n-type GaN layer 2; the n-type AlGaN clad cladding layer 3; the n-type GaN guide layer 4; the InGaN multiple quantum well active layer 5; the undoped-GaN guide layer 6; the p-type AlGaN electron overflow suppression layer 7; and the p-type GaN guide layer 8. That is, the nitride semiconductor layers are formed on the GaN substrate 1. Herein, blue-violet light emission of 405 nm is generated from the InGaN multiple quantum well active layer 5 by current injection. Also, the impurity concentration of the p-type GaN guide layer 8 is higher toward the direction from the InGaN multiple quantum well active layer 5 to the Ni/ITO cladding layer electrode 10.

On the SiO$_2$ blocking layer 9 formed on the p-type GaN guide layer 8, a striped (the direction of stripe is in a direction A shown in FIG. 2) opening with a width of 2 μm is formed. The Ni/ITO cladding layer electrode 10 is formed on the p-type GaN guide layer 8 and the SiO$_2$ blocking layer 9 so as to embed the striped opening. The Ti/Au pad electrode 11 is formed on the Ni/ITO clad electrode 10 and the Ti/Al/Ni/Au electrode 12 is formed on the backside of the GaN substrate 1.

The Ni/ITO cladding layer electrode 10 serves as an ohmic electrode to the p-type layer. That is, the Ni/ITO cladding layer electrode 10 has a resistivity of $10^{-4}$ Ωcm or less, and serves as an ohmic electrode for the p-type GaN guide layer 8. For example, the contact resistance against the p-type GaN guide layer 8 of the Ni/ITO cladding layer electrode 10 becomes $10^{-3}$ Ωcm$^2$ or less.

In the Ni/ITO cladding layer electrode 10, the Ni on the interface is spread on the surface and changes into the NiO by sintering under the O$_2$ atmosphere for reducing the contact resistance. Therefore, absorption of light emitted from the active layer is small so that said light is passed through. Also, the refractive index of the ITO for the wavelength of 405 nm is 2.1, and the refractive index of the SiO$_2$ for the wavelength of 405 nm is 1.46 so that the refractive index of the Ni/ITO cladding layer electrode 10 is bigger than the refractive index of the SiO$_2$ blocking layer 9. Further, the refractive index of the Ni/ITO cladding layer electrode 10 is smaller than about 2.3 which is a refractive index of the InGaN multiple quantum well active layer 5 and close to the refractive index of the InGaN multiple quantum well active layer 5.

In the semiconductor laser device having the above mentioned structure, the Ni/ITO cladding layer electrode 10 embedded in the striped opening of the SiO$_2$ blocking layer 9 serves as a cladding layer which confines light in a waveguide of the blue-violet laser, that is, in a ridge-striped waveguide, based on a difference of the refractive indexes between the Ni/ITO cladding layer electrode 10 and the SiO$_2$ blocking layer 9. Then, the light is confined in the Ni/ITO cladding layer electrode 10 formed inside the opening.

Consequently, the p-type AlGaN cladding layer in the conventional semiconductor laser device is replaced to the Ni/ITO cladding layer electrode 10 which is polycrystalline or amorphous. Therefore, the AlGaN layer which is one of the epitaxial growth layers becomes thinner so that stress in the layer is reduced and the crack generated during or after the epitaxial growth is reduced. As the result, it is unlikely to be affected by the crack generated in the AlGaN layer so that a high-yield semiconductor laser device is realized. Also, at the same time, the epitaxial growth layers, in particular, the AlGaN layer of which the growth rate is decreased and which requires long time for the growth, become thinner so that time for crystal growth is shortened and the manufacturing cost is reduced. Further, since the cladding layer becomes a low-resistance layer, the operational voltage becomes small.

As described in the above, according to the semiconductor device in the present embodiment, a striped opening is formed in the SiO$_2$ blocking layer on the p-type guide layer. Then, the Ni/ITO cladding layer electrode which is also the p-type cladding layer and the p-type ohmic electrode is formed in the opening. Therefore, the crack generated in the epitaxial growth layer is reduced and high yielding is realized. Also, at the same time, the epitaxial growth time can be shorted so that lower cost can be realized.

Here, in the semiconductor laser device according to the present embodiment, the semiconductor laser structure is formed on the GaN substrate. However, as long as a dislocation density in a range of, for example, $10^6$cm$^{-2}$, the semiconductor laser structure may be formed on a different substrate using an Epitaxial Lateral Overgrowth (ELOG) so as to position the waveguide on a low-dislocated portion above an insulation film such as SiO$_2$ which is patterned in stripe. Also, the semiconductor laser structure may be formed, for example, on an AlN layer on the sapphire substrate, for low dislocation.

Further, as a transparent electrode which serves as a cladding layer and a p-type electrode, the Ni/ITO cladding layer electrode which is made of indium tin oxide (ITO) doped with Sn and Ni is shown as an example. However, the transparent electrode is not only limited to the example, if the following conditions are met: absorption of laser light (blue-violet light emission of 405 nm) is sufficiently small; the refractive index is found between the refractive index of a material (SiO$_2$) making up the blocking layer and the refractive index of a material making up the active layer; and it serves as a good ohmic electrode for the p-type layer (p-type GaN layer). The transparent electrode thus may be made of an electrically conductive oxide, for example, such as antimony oxide doped with tin (ATO), zinc oxide (ZnO) or single layer ITO. Also in this case, a striped opening is formed in a blocking layer formed on the p-type GaN guide layer. By forming a transparent electrode which serves as a p-type cladding layer and a p-type ohmic electrode so as to cover the opening, high yielding and lower cost can be realized.

Furthermore, while it is described that the blocking layer is made of the $SiO_2$, it is not limited to $SiO_2$ if made of a dielectric. For example, it may be made of SiN, $Nb_2O_5$, $ZrO_2$ or $Ta_2O_5$.

Next, it is explained about a method of manufacturing the blue-violet semiconductor laser device having the structure described above along with the schematic cross-sections shown in FIG. 3A to FIG. 3D.

Figure 3A:
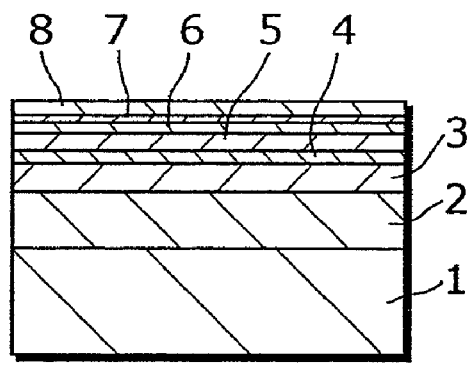
FIG. 3A is a schematic cross-section for explaining a method of manufacturing the semiconductor laser device.

First, as shown in FIG. 3A, the following layers are sequentially formed on a (0001) basal plane of the GaN substrate of which the dislocation density is in a range of, for example, $10^6 cm^{-2}$ using the MOCVD technique and the like: the n-type GaN layer 2; the n-type AlGaN cladding layer 3; the n-type GaN guide layer 4; the InGaN multiple quantum well active layer 5; an undoped-GaN guide layer 6; a p-type AlGaN electron overflow suppression layer 7; and a p-type GaN guide layer 8. Herein, the n-type layer is formed, for example, by Si doping using $SiH_4$ gas. The p-type layer is formed, for example, by Mg doping using $Cp_2Mg$.

Figure 3B:
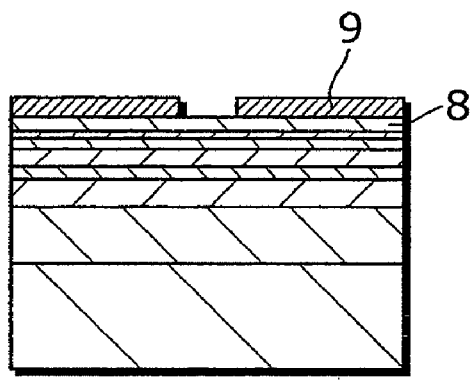
FIG. 3B is a schematic cross-section for explaining the method of manufacturing the semiconductor laser device.

Next, as shown in FIG. 3B, the $SiO_2$ blocking layer 9 having a thickness of about 500 nm is formed on the p-type GaN guide layer 8 by a Chemical Vapor Deposition (CVD method) method using, for example, $SiH_4$ gas and $O_2$ gas. After that, a photoresist having a striped opening (a width of stripes is about 2 μm) is formed on the $SiO_2$ blocking layer 9. Using the photoresist as a mask, a portion of the $SiO_2$ blocking layer 9 is selectively removed by performing Reactive Ion etching (RIE) using, for example, $CF_4$ gas and $O_2$ gas.

Figure 3C:
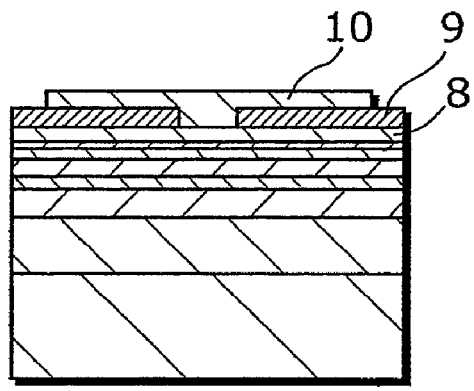
FIG. 3C is a schematic cross-section for explaining the method of manufacturing the semiconductor laser device.

Next, as shown in FIG. 3C, for example, the Ni/ITO cladding layer electrode 10 is formed on the $SiO_2$ blocking layer 9 and the p-type GaN guide layer 8 inside the striped opening using a vapor deposition of electronic beam and lift-off. After that, in order to reduce the contact resistance of the p-type layer, sintering is performed, for example, in an $O_2$ atmosphere at 600° C. By the sintering processing, Ni moves near the surface of the Ni/ITO cladding layer electrode 10 as NiO. Therefore, internal loss by the optical absorption inside the cladding layer is reduced as much as a level necessary for laser oscillation. Herein, in order to improve cleavage and orientation of the Ni/ITO cladding layer electrode 10, it is desired to form the Ni/ITO cladding layer by an ablation method using excimer laser called Pulsed Laser Deposition (PLD). Note that, a layer having higher concentration of Mg than the inside of the p-type GaN guide layer 8 may be formed on the top surface of the p-type GaN guide layer 8 for the purpose of reducing the contact resistance.

Figure 3D:
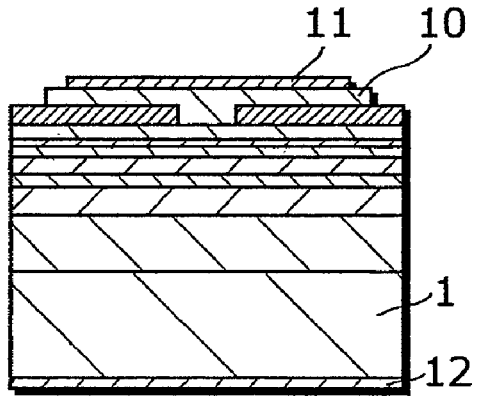
FIG. 3D is a schematic cross-section for explaining the method of manufacturing the same semiconductor layer.

Next, as shown in FIG. 3D, the Ti/Au pad electrode 11 is formed on the Ni/ITO cladding layer electrode 10 as a pad electrode of the p type layer, for example, by vapor deposition of the electric beam and lift-off. After that, the GaN substrate 1 is polished so as to be thin as, for example, 150 μm, and the Ti/Al/Ni/Au electrode 12 is formed on the backside of the GaN substrate 1 as an ohmic electrode for the n-type layer. Following that, a wafer is cleavaged in a direction perpendicular to the stripe direction so as to form a resonator mirror of the semiconductor laser device. Consequently, the semiconductor laser device having the structure shown in FIG. 2 is constructed. Herein, in order to form a mirror with refractivity by improving the flatness of the cleavage plane, higher orientation of the Ni/ITO cladding layer electrode 10 is preferred.

As described in the above, unlike the method of manufacturing the conventional semiconductor laser device, the method of manufacturing the semiconductor laser device according to the present embodiment does not include the process of forming a waveguide by dry-etching the p-type AlGaN cladding layer in stripes. In other words, it does not include the process of dry-etching the GaN semiconductor. Therefore, a damage layer is not formed around the waveguide by the dry-etching and the leakage current which results in the damage layer does not occur. Accordingly, the semiconductor laser device for low operating current with smaller leakage current can be realized.

Also, unlike the method of manufacturing the conventional semiconductor laser device, in the method of manufacturing the semiconductor laser device according to the present embodiment, the thickness of the p-type layer is not determined by etching rate of the dry etching, but determined only by the thickness of the p-type guide layer grown by the epitaxial growth. In respect to a structural design of the high-output semiconductor laser device, it is very important to control the thickness of the p-type layer on the side of the waveguide. If the thickness of the p-type layer changes, a beam divergence angle (parallel divergence angle) in a direction parallel to the bonding plane largely changes, while a level of light output at which kink is generated in current-light characteristics (kink level) changes. Consequently, it becomes easier to control the thickness of the p-type layer, which is very important in consideration of an application to a light source of the optical disc. Therefore, the reproducibility and uniformity of the thickness of the p-type layer on the side of the waveguide are improved so that the high-output semiconductor laser device which can improve in yield can be realized.

Second Embodiment

Figure 4:
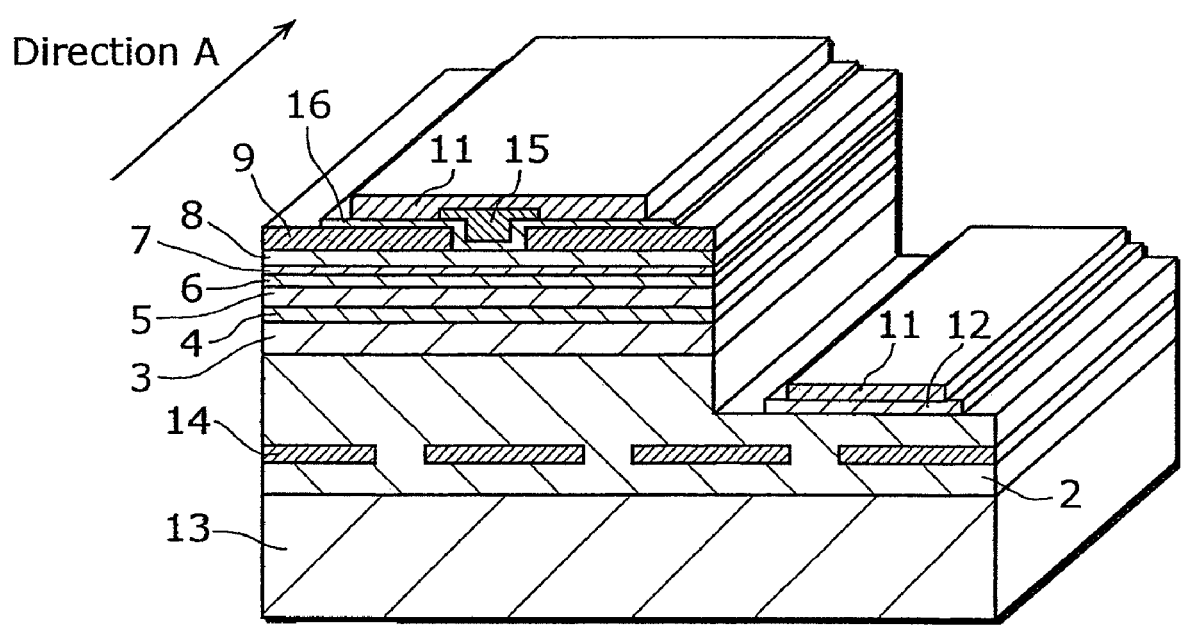
FIG. 4 is a perspective view showing a structure of a blue-violet semiconductor laser device according to the second embodiment of the present invention.

FIG. 4 is a perspective view showing a structure of a blue-violet semiconductor laser device according to the second embodiment.

The semiconductor laser device has a sapphire substrate 13, an n-type GaN layer 2, an $SiO_2$ mask 14, an n-type AlGaN cladding layer 3, an n-type GaN guide layer 4, an InGaN multiple quantum well active layer 5, an undoped-GaN guide layer 6, a p-type AlGaN electron overflow suppression layer 7, a p-type GaN guide layer 8, an $SiO_2$ blocking layer 9, an Ni/ITO thin film electrode 16 as a transparent electrode, an $Nb_2O_5$ cladding layer 15 as a dielectric layer, a Ti/Au pad electrode 11 and a Ti/Al/Ni/Au electrode 12.

The following layers are sequentially formed on the sapphire substrate 13 by the epitaxial growth technique using, for example, the MOCVD technique and the like: the n-type GaN layer 2; the n-type AlGaN cladding layer 3; the n-type GaN guide layer 4; the InGaN multiple quantum well active layer 5; the undoped-GaN guide layer 6; the p-type AlGaN electron overflow suppression layer 7; and the p-type GaN guide layer 8. Herein, the blue-violet light is emitted for 405 nm from the InGaN multiple quantum well active layer 5 by current injection. Also, the impurity concentration of the p-type GaN guide layer 8 increases in a direction from the InGaN multiple quantum well active layer 5 to the Ni/ITO thin film electrode 16.

In the n-type GaN layer 2, the striped $SiO_2$ masks 14 with the width of, for example, 10 μm are formed. The $SiO_2$ masks 14 are formed as follows: a portion of the n-type GaN layer 2 is formed on the sapphire substrate 13; the SiO$_2$ masks 14 are then formed on the portion; and after that, rest of the n-type GaN layer 2 is formed using ELOG, in a horizontal direction on the portion of the n-type GaN layer 2 so as to cover the SiO$_2$ masks 14. In the epitaxial growth layer formed on the SiO$_2$ masks 14, the dislocation density becomes in a range of $10^6$ cm$^{-2}$. In other words, the dislocation density is reduced from the dislocation density in a range of $10^9$ cm$^{-2}$ for other epitaxial growth layers.

In the SiO$_2$ blocking layer 9 formed on the p-type GaN guide layer 8, a striped (the direction of stripe is in a direction of A shown in FIG. 4) opening of which the width is, for example, 5 μm is formed. The striped opening in the SiO$_2$ blocking layer 9 is positioned above the SiO$_2$ mask 14 and a waveguide is formed in a portion where has a small dislocation density. On the p-type GaN guide layer 8 and the SiO$_2$ blocking layer 9, the Nb$_2$O$_5$ cladding layer 15 and the Ni/ITO thin film electrode 16 are selectively formed so as to embed the striped opening. On the Nb$_2$O$_5$ cladding layer 15, the Ti/Au pad electrode 11 is formed as a pad electrode of the p-type layer so as to contact with the Ni/ITO thin film electrode 16. The Nb$_2$O$_5$ cladding layer 15 is formed above the p-type GaN guide layer 8, having the Ni-ITO thin film electrode 16 in between. The Ti/Al/Ni/Au electrode 12 as an electrode for the n-type layer is formed on the surface of the n-type GaN layer 2 which is exposed by selectively removing a portion of the epitaxial growth layer and the SiO$_2$ blocking layer 9.

The Ni/ITO thin film electrode 16 serves as an ohmic electrode for the p-type layer. That is, the Ni/ITO thin film electrode 16 serves as the ohmic electrode for the p-type GaN guide layer 8. For example, the contact resistance of the Ni/ITO thin film electrode 16 against the P-type GaN guide layer 8 is $10^{-3}$ Ωcm$^2$ or less.

Here, the thickness of the Ni/ITO thin film electrode 16 is, for example, thinner than about 10 nm. Therefore, it absorbs small amount of light emitted from the active layer so that light from the active layer passes through.

In addition, for the wavelength of 405 nm, the refractive index of the SiO$_2$ blocking layer 9 is 1.46 and the refractive index of the Nb$_2$O$_5$ cladding layer 15 is 2.1. Therefore, the refractive index of the Nb$_2$O$_5$ cladding layer 15 is larger than the refractive index of the SiO$_2$ blocking layer 9. Further, the refractive index of the Nb$_2$O$_5$ cladding layer 15 is smaller than the refractive index of about 2.3 of the InGaN multiple quantum well active layer 5 and closer to the refractive index of the InGaN multiple quantum well active layer 5.

In the semiconductor laser device having the above mentioned structure, the Nb$_2$O$_5$ cladding layer 15 and the Ni/ITO thin film electrode 16 that are embedded in the striped opening of the SiO$_2$ blocking layer 9 serves as a cladding layer which confines light in the waveguide, in other words, in the ridge-striped waveguide, depending on the refractive index difference between the Nb$_2$O$_5$ cladding layer 15 and the SiO$_2$ blocking layer 9. Thus, the light is confined in the Nb$_2$O$_5$ layer 15 and the Ni/ITO thin film electrode 16 that are formed inside the opening.

Consequently, the p-type AlGaN cladding layer in the conventional semiconductor laser device is replaced to the amorphous Nb$_2$O$_5$ cladding layer 15 and Ni/ITO thin film electrode 16. Therefore, the AlGaN layer among the epitaxial growth layers becomes thinner so that the stress in the layer is reduced and the crack generated during or after the epitaxial growth is reduced. As the result, it is unlikely to be affected by the crack generated in the AlGaN layer so that a high-yield semiconductor laser device is realized. At the same time, the thicknesses of the epitaxial growth layers, in particular, the thickness of the AlGaN layer which has slow growth rate and requires long time for growth, become thinner. Therefore, time for crystal growth is shortened and the manufacturing cost is reduced. Further, a portion of the cladding layer becomes a low resistance layer so that operating voltage becomes small.

As described in the above, according to the semiconductor laser device in the present embodiment, a striped opening is formed in the SiO$_2$ blocking layer on the p-type guide layer and the Nb$_2$O$_5$ cladding layer and Ni/ITO thin film electrode are formed inside the opening. Therefore, the crack generated in the epitaxial growth layers can be reduced and high yielding can be realized. At the same time, it is possible to make the epitaxial growth layer thinner and the growth time shorter. As the result, lower cost can be realized.

Further, according to the semiconductor laser device in the present embodiment, the Nb$_2$O$_5$ cladding layer 15 serves as a cladding layer. Therefore, compared to the semiconductor laser device in the first embodiment, optical absorption in the waveguide can be reduced so that a high-output semiconductor laser device can be realized.

Furthermore, according to the semiconductor laser device in the present embodiment, the striped opening in the SiO$_2$ blocking layer 9 is positioned above the SiO$_2$ mask 14. Therefore, the active layer and the waveguide are formed in a portion where has a small dislocation density so that a long-lived semiconductor laser device can be realized.

Note that, in the semiconductor laser device according to the present embodiment, the semiconductor laser structure is formed on the sapphire substrate using ELOG so as to position the waveguide in a portion where the dislocation density is low.

However, the semiconductor laser structure may be formed on a GaN substrate as long as the dislocation density in a range of, for example, $10^6$ cm$^{-2}$ can be realized. Also, the semiconductor laser structure may be formed on the AlN layer, for example, formed on the sapphire substrate giving lower dislocation density.

In addition, the Nb$_2$O$_5$ cladding layer is shown as an example of a dielectric layer which serves as a cladding layer. However, it is not limited to the example if the absorption of laser light (blue-violet light emission of 405 nm) is sufficiently small and the refractive index is between the refractive index of a material (SiO$_2$) making up the blocking layer and the refractive index of a material making up the active layer. The dielectric layer may be made of a dielectric, for example, such as SiN, ZrO$_2$, TiO$_2$ or Ta$_2$O$_5$. Similarly, the Ni/ITO thin film electrode is shown as an example of a transparent electrode which serves as a cladding layer and a p-type electrode. However, it is not limited to the example if the material absorbs sufficiently small amount of laser light (blue-violet light emission of 405 nm), and serves as a preferred ohmic electrode for the p-type layer (p-type GaN layer). Thus, the transparent electrode may be made of, for example, ATO, ZnO or single layer ITO.

Next, it is explained about a method of manufacturing the blue-violet semiconductor laser device having the above mentioned structure along with the schematic cross-sections shown as FIG. 5A to FIG. 5F.

Figure 5A:
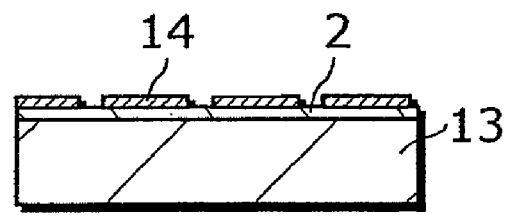
FIG. 5A is a schematic cross-section for explaining a method of manufacturing the semiconductor laser device.

First, as shown in FIG. 5A, the n-type GaN layer 2 is formed, for example, on the (0001) basal plane of the sapphire substrate 13 by the MOCVD technique and the like. After that, on the n-type GaN layer 2, a SiO$_2$ mask 14 of about 100 nm is formed, for example, by a CVD method using SiH$_4$ gas and O$_2$ gas. Following that, striped openings, each of which has a width of about 5 μm, are formed in the SiO$_2$ mask 14 by selective etching using hydrogen fluoride (HF) solution and photoresist as a mask, so as to form striped SiO$_2$ masks 14, each of which has a width of about 10 μm.

Figure 5B:
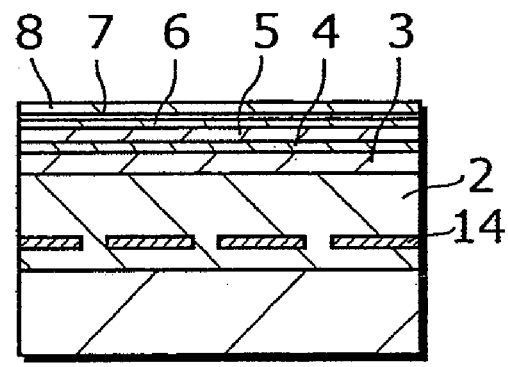
FIG. 5B is a schematic cross-section for explaining the method of manufacturing the semiconductor laser device.

Next, as shown in FIG. 5B, the following layers are sequentially formed so as to make the layers grow starting from the n-type GaN layer 2 which is exposed from the openings of the SiO$_2$ masks 14, for example, using the MOCVD technique and the like: the n-type GaN layer 2; the n-type AlGaN cladding layer 3; the n-type GaN guide layer 4; the InGaN multiple quantum well active layer 5; the undoped-GaN guide layer 6; the p-type AlGaN electron overflow suppression layer 7; and the p-type GaN guide layer 8. In the crystal growth, the layers are formed in horizontal direction on the SiO$_2$ masks 14 using ELOG. Therefore, a threading dislocation density is largely reduced in the epitaxial growth layer formed above the SiO$_2$ masks 14 and the dislocation density in a range of $10^6$ cm$^{-2}$ is obtained as the result. Herein, the n-type layer is formed by Si doping using, for example, SiH$_4$ gas and the p-type layer is formed by Mg doping using, for example, Cp$_2$Mg.

Figure 5C:
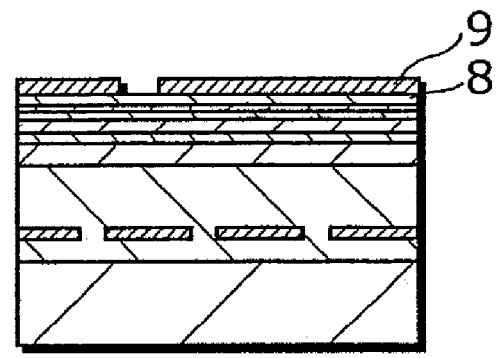
FIG. 5C is a schematic cross-section for explaining the method of manufacturing the semiconductor laser device.

Next, as shown in FIG. 5C, the SiO$_2$ blocking layer 9 having the thickness of 500 nm is formed on the p-type GaN guide layer 8 by the CVD method. After that, photoresist having striped openings (width of strip is about 2 μm) is formed on the SiO$_2$ blocking layer 9. Using the photoresist as a mask, a portion of the SiO$_2$ blocking layer 9 is selectively removed, for example, by performing RIE.

Figure 5D:
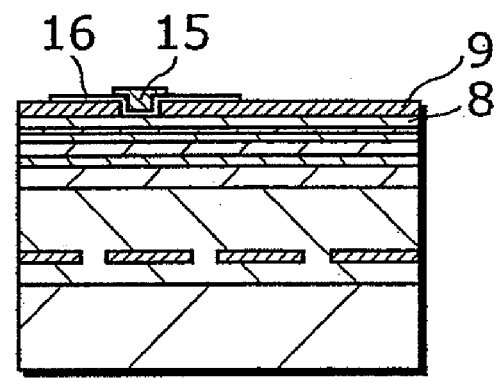
FIG. 5D is a schematic cross-section for explaining the method of manufacturing the semiconductor laser device.

Then, as shown in FIG. 5D, for example, by electron beam evaporation and lift-off, the Ni/ITO thin film electrode 16 as a p-type ohmic electrode is formed on the SiO$_2$ blocking layer 9 and the p-type GaN guide layer 8 in the striped opening. After that, for example, by electron beam evaporation and lift-off, the striped Nb$_2$O$_5$ cladding layer 15 is formed on the Ni/ITO thin film electrode 16 so as to at least a portion is formed in the striped opening of the SiO$_2$ blocking layer 9. Herein, in order to reduce contact resistance of the p-type layer, sintering is performed in an O$_2$ atmosphere at, for example, 600° C. after the Ni/ITO thin film electrode 16 or the Nb$_2$O$_5$ cladding layer 15 is formed. With the sintering, Ni is moved to close to the surface of the Ni/ITO thin film electrode 16 as NiO. Therefore, internal loss in the cladding layer by optical absorption becomes as small as the amount necessary for laser oscillation. Note that, on the top surface of the p-type GaN guide layer 8, a layer of which the Mg concentration is higher than inside the p-type GaN guide layer 8 may be formed for the purpose of reducing the contact resistance.

Figure 5E:
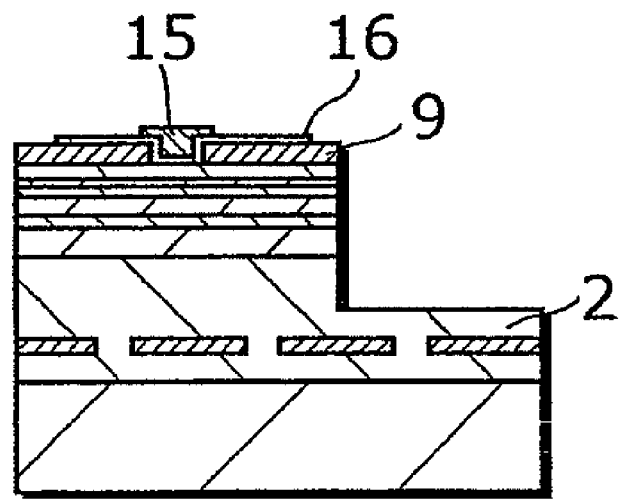
FIG. 5E is a schematic cross-section for explaining the method of manufacturing the semiconductor laser device.

Next, as shown in FIG. 5E, for example, by dry etching such as Inductive Coupled Plasma (ICP) etching, portions of the epitaxial growth layer and the SiO$_2$ blocking layer 9 are selectively removed so as to expose the surface of the n-type GaN layer 2. Here, the surface of the n-type GaN layer 2 is exposed in a form of having an opening parallel to the opening pattern of the SiO$_2$ blocking layer 9 which has a striped ridge waveguide structure.

Figure 5F:
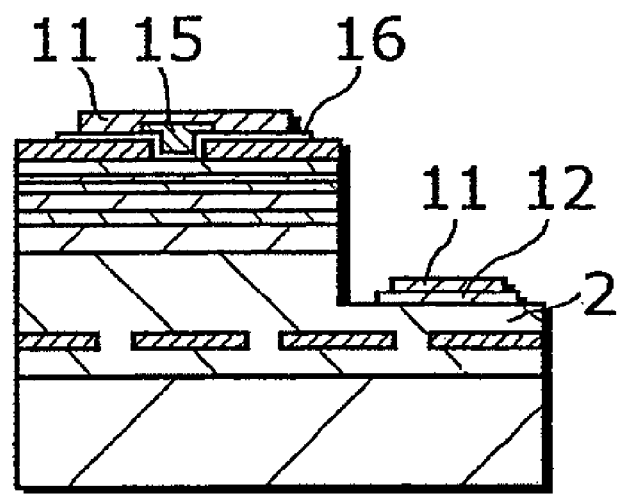
FIG. 5F is a schematic cross-section for explaining the method of manufacturing the semiconductor laser device.

Then, as shown in FIG. 5F, for example, by electron beam evaporation and the lift-off, the Ti/Au pad electrode 11 is formed in the Nb$_2$O$_5$ cladding layer 15 as a pad electrode of the p-type layer so as to cover the Nb$_2$O$_5$ cladding layer 15, and to contact with the Ni/ITO thin film electrode 16. After that, for example, by electron beam evaporation and the lift-off, the Ti/Al/Ni/Au electrode 12 and the Ti/Au pad electrode 11 are formed on the n-type GaN layer 2. Consequently, the semiconductor laser device with the structure shown in FIG. 4 is manufactured. Herein, in order to form a mirror with high refractivity by increasing flatness of the cleavage plane, the Nb$_2$O$_5$ cladding layer 15 with higher orientation is preferred and it is desired to form the Nb$_2$O$_5$ cladding layer 15 by the manufacturing method such as PLD.

As described in the above, unlike the conventional method of manufacturing the semiconductor laser device, the method of manufacturing the semiconductor laser device in the present embodiment does not include a process of forming a waveguide by dry etching the p-type AlGaN cladding layer in stripes. That is, it does not include the process of dry etching the GaN semiconductor. Therefore, a damaged layer by the dry etching is not formed around the waveguide so that leakage current result in the damaged layer is not generated. Thus, a semiconductor laser device with smaller leakage current and low operating current is realized.

Further, unlike the method of manufacturing the conventional semiconductor laser device, by the method of manufacturing the semiconductor laser device in the present embodiment, the thickness of the p-type layer is not determined by an etching rate of the dry etching, but determined only by a thickness of the p-type guide layer grown by the epitaxial growth. Therefore, larger parallel beam divergence angle and a higher kink level in the current-light characteristics can be obtained so that a high-output semiconductor laser device which can improve yielding can be realized.

Third Embodiment

Figure 6:
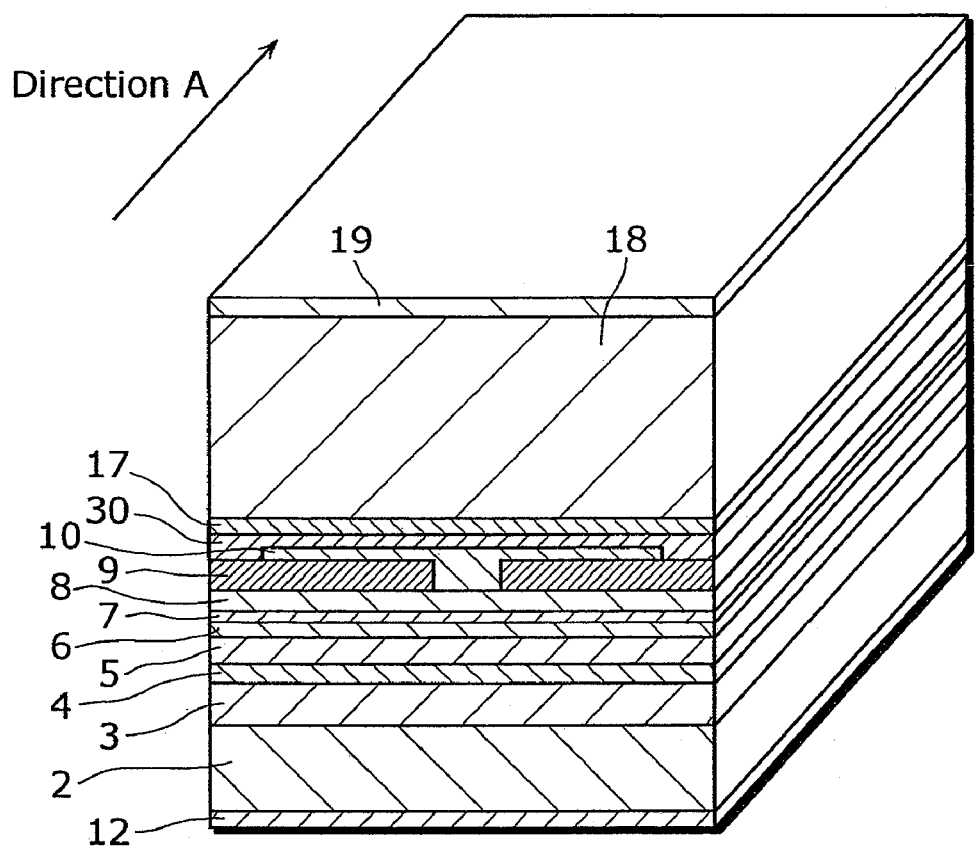
FIG. 6 is a perspective view showing a blue-violet semiconductor laser device according to a third embodiment of the present invention.

FIG. 6 is a perspective view showing a structure of a blue-violet semiconductor laser device according to the third embodiment.

The semiconductor laser device has an n-type GaN layer 2, an n-type AlGaN cladding layer 3, an n-type GaN guide layer 4, an InGaN multiple quantum well active layer 5, an undoped-GaN guide layer 6, a p-type AlGaN electron overflow suppression layer 7, a p-type GaN guide layer 8, an SiO$_2$ blocking layer 9, an Ni/ITO cladding layer electrode 10, a Ti/Au electrode 30 as a metal film, a Ti/Al/Ni/Au electrode 12, an Au/AuSn/Au/Ni electrode 17 as a metal film, a low resistance SiC substrate 18 and an Ni/Au electrode 19.

The following layers are sequentially formed on the n-type GaN layer 2: the n-type AlGaN cladding layer 3; the n-type GaN guide layer 4; an InGaN multiple quantum well active layer 5; an undoped-GaN guide layer 6; the p-type AlGaN electron overflow suppression layer 7; and the p-type GaN guide layer 8. Herein, blue-violet light of 405 nm is emitted from the InGaN multiple quantum well active layer 5 by a current injection.

The SiO$_2$ blocking layer 9 formed on the p-type GaN guide layer 8 has a striped (the direction of the strip is the direction A shown in FIG. 6) opening. On the p-type GaN guide layer 8 and the SiO$_2$ blocking layer 9, the Ni/ITO cladding layer electrode 10 is formed so as to embed the striped opening. The Ti/Au electrode 30 is formed on the Ni/ITO cladding layer electrode 10 and the SiO$_2$ blocking layer 9. The Au/AuSn/Au/Ni electrode 17, the low resistance SiC substrate 18, and the Ni/Au electrode 19 which serves as an ohmic electrode for the p-type layer are sequentially formed on the Ti/Au electrode 30. The Ti/Al/Ni/Au electrode 12 which serves as an ohmic electrode for the n-type layer is formed on the n-type GaN layer 2.

The Ni/ITO cladding layer electrode 10 serves as an ohmic electrode for the p-type layer. That is, the Ni/ITO cladding layer electrode 10 serves as an ohmic electrode for the p-type GaN guide layer 8.

Here, the epitaxial growth layer is bonded with the low resistance SiC substrate 18 having the Ti/Au electrode 30 and the Au/AuSn/Au/Ni electrode 17 in between so as to match the cleavage direction of the epitaxial growth layer with the cleavage direction of the low resistance SiC substrate 18. After that, the epitaxial growth layer is separated from, for example, the sapphire substrate used for the crystal growth. Herein, the epitaxial growth layer and the low resistance SiC substrate 18 are bonded so that the cleavage plane of the low resistance SiC substrate 18 is perpendicular to the direction of the stripe, specifically, the direction along with the waveguide of the semiconductor laser device (direction of the resonator).

In the semiconductor laser device having the above mentioned structure, the Ni/ITO cladding layer electrode 10 embedded in the striped opening of the SiO$_2$ blocking layer 9 serves as a waveguide of the blue-violet laser which is confined by the difference of the refractive indexes between the Ni/ITO cladding layer electrode 10 and the SiO$_2$ blocking layer 9. The light is confined in the Ni/ITO cladding layer electrode 10 that is formed inside the opening.

Consequently, similar to the semiconductor laser device in the first embodiment, the AlGaN layer among the epitaxial growth layers becomes thinner. Therefore, the crack generated during or after the epitaxial growth is reduced and a high-yield semiconductor laser device is realized. Also, at the same time, the epitaxial growth layer, in particular to the AlGaN layer which has slow growth rate and requires long time for growth becomes thinner so that the crystal growth time is shortened and the manufacturing cost is reduced. Further, the cladding layer becomes a low resistance layer so that the level of operating voltage becomes small. Furthermore, the Ni/ITO cladding layer electrode 10 is sandwiched between the low resistance SiC substrate 18 and the epitaxial growth layer, and the cleavage planes of the epitaxial growth layer and the low resistance SiC substrate 18 are matched. Therefore, it is possible to form a flat resonator mirror so that the semiconductor laser device for low threshold current can be realized.

As described in the above, according to the semiconductor laser device in the present embodiment, a striped opening is formed in the SiO$_2$ blocking layer on the p-type guide layer. The Ni/ITO cladding layer electrode which serves as a cladding layer is formed so as to cover the opening. Therefore, the crack among the epitaxial growth layers can be reduced and high yielding can be realized. At the same time, the epitaxial growth layer can be thinner and the growth time can be shorter. Consequently, low cost can be realized.

Further, according to the semiconductor laser device in the present embodiment, the epitaxial growth layer is bonded with the SiC substrate so as to match the cleavages. Therefore, a semiconductor laser device with low threshold current and good cleavage can be realized even in the present semiconductor laser device which includes layers that are difficult to produce cleavages such as the Ni/ITO cladding layer electrode.

Furthermore, the semiconductor laser device according to the present embodiment has a SiC substrate. Therefore, a long-lived semiconductor laser device for good thermal condition can be realized.

Note that, the Ni/ITO cladding layer electrode is shown as an example of a transparent electrode which serves as the cladding layer and the p-type electrode. However, the transparent electrode is not limited to the example if followings conditions are met: it absorbs sufficiently small amount of laser light (blue-violet light emission of 405 nm); it has a refractive index between the refractive index of a material (SiO2) which making up the blocking layer and the refractive index of a material which making up the active layer; and it serves as a good ohmic electrode for the p-type layer (p-type GaN layer). For example, the transparent electrode may be made of conductive oxide such as ATO ZnO or single layer ITO. Also, the SiC substrate is shown as an example of a substrate to which the epitaxial growth layer is bonded. However, the substrate is not only limited to the example, if the substrate has good thermal condition and cleavage. The substrate to which the epitaxial growth layer is bonded may be, for example, an InP substrate, an Si substrate or a GaAs substrate.

Further, the Ti/Au electrode 30 and the Au/AuSn/Au/Ni electrode 17 are shown as examples of a metal film which bonds the low resistance SiC substrate 18 and the epitaxial growth layer. However, the metal film is not limited to the examples if it includes Au and AuSn.

Next, it is explained about a method of manufacturing the blue-violet semiconductor laser device having the above mentioned structure along with the schematic cross-sections shown as FIG. 7A to FIG. 7G.

Figure 7A:
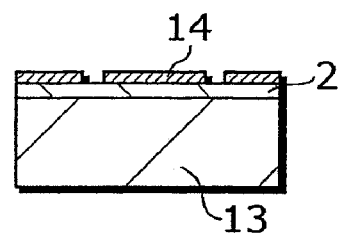
FIG. 7A is a schematic cross-section for explaining a method of manufacturing the semiconductor laser device.

First, as shown in FIG. 7A, similar to the method of manufacturing the semiconductor laser device according to the second embodiment, an n-type GaN layer 2 is formed by the MOCVD technique and the like on the (0001) basal plane of the sapphire substrate. After that, on the n-type GaN layer 2, striped SiO$_2$ masks 14, each of which having the thickness of about 100 nm is formed so as to have a width of about 10 μm having intervals of 5 μm by the CVD method and wet etching.

Figure 7B:
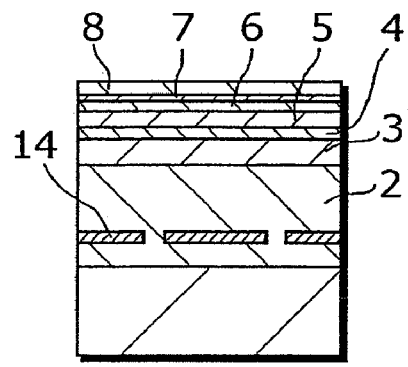
FIG. 7B is a schematic cross-section for explaining the method of manufacturing the semiconductor laser device.

Next, as shown in FIG. 7B, so as to grow from the n-type GaN layer 2 exposed at the openings of the SiO$_2$ masks 14, the following layers are formed, for example, by the MOCVD technique and the like: the n-type GaN layer 2; the n-type AlGaN cladding layer 3; the n-type GaN guide layer 4; the InGaN multiple quantum well active layer 5; the undoped-GaN guide layer 6; the p-type AlGaN electron overflow suppression layer 7; and the p-type GaN guide layer 8, In the crystal growth, the SiO$_2$ mask 14 is formed in a horizontal direction using ELOG. Therefore, in the epitaxial growth layer formed above the SiO$_2$ mask 14, the dislocation density is largely reduced. As the result, the dislocation density becomes in a range of $10^6$ cm$^{-2}$. Herein, the n-type layer is formed, for example, by Si doping using SiH$_4$ gas. The p-type layer is formed, for example, by Mg doping using Cp$_2$Mg.

Figure 7C:
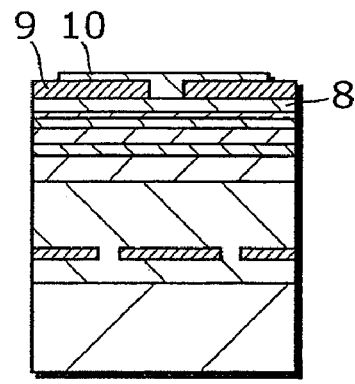
FIG. 7C is a schematic cross-section for explaining the method of manufacturing the semiconductor laser device.

Then, as shown in FIG. 7C, the SiO$_2$ blocking layer 9 having the thickness of about 500 nm is formed on the p-type GaN guide layer 8 by the CVD method. After that, a striped opening (the width of stripe is about 2 μm) is formed on the SiO$_2$ blocking layer 9, for example, by performing RIE. Following that, the Ni/ITO cladding layer electrode 10 is formed on the SiO$_2$ blocking layer 9 and the p-type GaN guide layer 8 in the striped opening, for example, by electron beam evaporation and lift-off. Herein, in order to reduce the contact resistance of the p-type layer, sintering is performed, for example, at 600° C. and O$_2$ atmosphere.

Figure 7D:
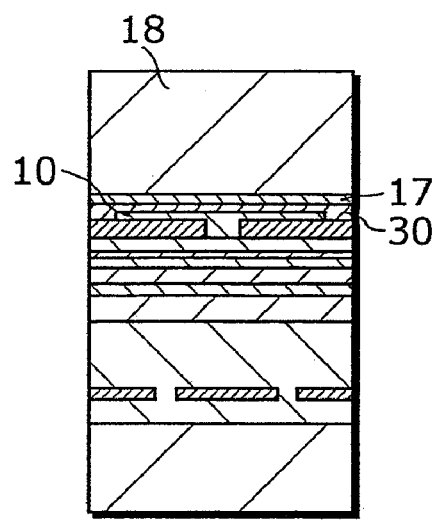
FIG. 7D is a schematic cross-section for explaining the method of manufacturing the semiconductor laser device.

Next, as shown in FIG. 7D, the Ti/Au electrode 30 is formed on the Ni/ITO cladding layer electrode 10, for example, by the electron beam evaporation. After that, the Au/AuSn/Au/Ni electrode 17 is formed on the (0001) basal plane of the low resistance SiC substrate 18, for example, by vacuum evaporation. Following that, weighting the substrates at, for example, 370° C., for bonding the substrates, so as to contact Au in the low resistance SiC substrate 18 with Au in the Ni/ITO cladding layer electrode 10. Herein, the substrates are bonded so as to match the cleavage directions of the <11-20> direction, the <110> direction or the <1-100> direction.

Figure 7E:
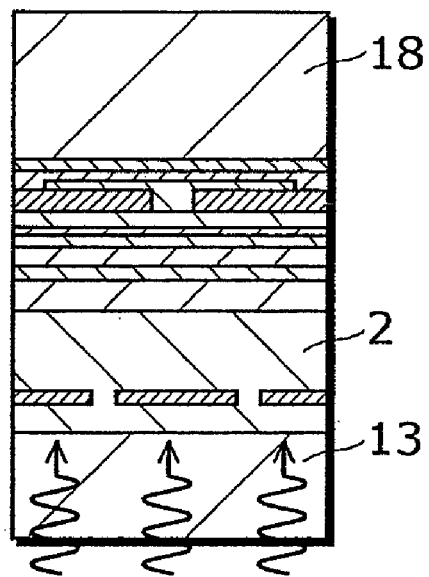
FIG. 7E is a schematic cross-section for explaining the method of manufacturing the semiconductor laser device.

Next, as shown in FIG. 7E, so as to scan the substrate plane, a KrF excimer laser (wavelength 248 nm) is irradiated from the backside of the sapphire substrate 13 on which the epitaxial growth layer is not formed. Herein, the irradiated laser light is not absorbed in the sapphire substrate 13, but absorbed only in the n-type GaN layer 2. Therefore, local heating is occurred and the GaN layer is decomposed near the interface between the sapphire substrate 13 and the n-type GaN layer 2. As the result, the sapphire substrate 13 is separated and removed, and the epitaxial growth layer bonded with the low resistance SiC substrate 18 is obtained. As a light source used for separating the sapphire substrate 13, the third harmonic (wavelength 355 nm) of pulsed YAG laser and a mercury lamp line (wavelength 365 nm) may be used in stead of the pulsed KrF excimer laser (wavelength 248 nm).

Figure 7F:
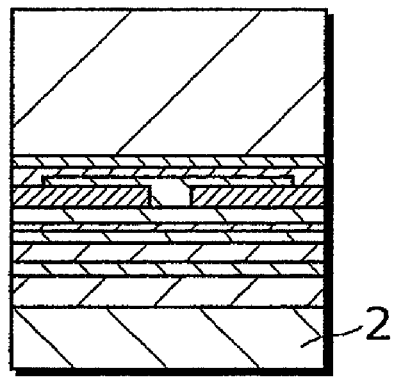
FIG. 7F is a schematic cross-section for explaining the method of manufacturing the semiconductor laser device.

Next, as shown in FIG. 7F, portions of the n-type GaN layer 2 and $SiO_2$ mask 14 are removed by polishing.

Figure 7G:
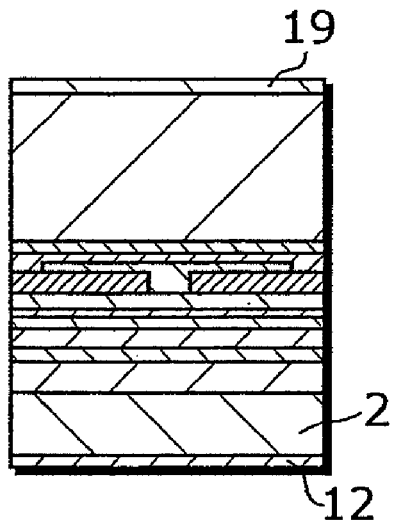
FIG. 7G is a schematic cross-section for explaining the method of manufacturing the semiconductor laser device.

After that, as shown in FIG. 7G, the Ti/Al/Ni/Au electrode 12 is formed on the n-type GaN layer 2 exposed by the polishing, for example, by the electron beam evaporation. Consequently, a semiconductor laser device having the structure shown in FIG. 6 is manufactured.

As described in the above, unlike the method of manufacturing the conventional semiconductor laser device, the method of manufacturing the semiconductor laser device according to the present embodiment does not include a process of forming a waveguide by dry etching the p-type AlGaN cladding layer in stripes. In other words, it does not include a process of dry etching the GaN semiconductor. Therefore, the damage layer is not formed near the waveguide by the dry etching so that the leakage current which results in the damage layer does not occur. Consequently, the semiconductor laser device for low operating current with smaller leakage current can be realized.

In the above, it is explained, based on the embodiments, about the semiconductor laser device and the method thereof according to the present invention. However, the present invention is not limited to the embodiments and it is not to mention that various in the exemplary embodiments without materially departing from the novel teachings and advantages of this invention. Accordingly, all such modifications are intended to be included within the scope of this invention.

For example, the GaN substrate and sapphire substrate may have any plane directions. It may have a plane direction with an off-angle from a representative plane such as (0001) basal plane. In addition, the substrate may be a SiC substrate, a ZnO substrate, a Si substrate, a GaAs substrate, a GaP substrate, an InP substrate, a $LiGaO_2$ substrate, an AlN substrate, a MgO substrate, a $LiAlO_2$ substrate, or an alloy of these. Further, the epitaxial growth layer may have any ratios of compositions unless desired laser characteristics can be realized, and may have any multilayer structures. Also, it may include a layer formed by a crystal growth such as Molecular Beam Epitaxy (MBE) or Hydride Vapor Phase Epitaxy (HVPE) instead of the MOCVD technique. The epitaxial growth layer may include V group elements such as As and P or III group elements such as B as composition elements. Furthermore, a method of forming dielectric film such as ITO and $Nb_2O_5$ which made up of a waveguide is not limited to the electron beam evaporation or PLD, but it may be a method such as RF spattering or ion beam spattering.

INDUSTRIAL APPLICABILITY

The present invention can be used for the semiconductor laser device and the method thereof, in particular for high-output or low-noise blue-violet semiconductor laser device and the like used as a source of writing on and reading from a high-density optical disc.

What is claimed is:

1. A semiconductor laser device comprising:
a light-emitting layer which is made of a semiconductor;
a current-blocking layer which is formed above said light-emitting layer so as to have an opening, and which is composed of a first dielectric, the current-blocking layer including a lower surface and an upper surface, the lower surface being closer to the light-emitting layer than the upper surface; and
a transparent electrode which is formed inside the opening, and which is transparent for light emitted from said light-emitting layer, and covers the upper surface of said current-blocking layer; and
a dielectric layer which is formed inside the opening, and which is made of a second dielectric,
wherein said dielectric layer is formed above said light-emitting layer so as to have said transparent electrode in between, and which has a refractive index that is higher than a refractive index of said current-blocking layer and smaller than a refractive index of said light-emitting layer.

2. The semiconductor laser device according to claim 1, wherein said transparent electrode is made of a conductive oxide, and has a refractive index which is higher than a refractive index of said current-blocking layer and smaller than a refractive index of said light-emitting layer.

3. The semiconductor laser device according to claim 2, wherein the conductive oxide is one of indium oxide doped with tin, tin oxide doped with antimony, and zinc oxide.

4. The semiconductor laser device according to claim 1, wherein the second dielectric is one of SiN, $Nb_2O_5$, $ZrO_2$, $TiO_2$ and $Ta_2O_5$.

5. The semiconductor laser device according to claim 1, further comprising a p-type light-guiding layer which is made of a semiconductor, and which is formed between said light-emitting layer and said current-blocking layer so as to contact with said transparent electrode.

6. The semiconductor laser device according to claim 5, wherein an impurity concentration of said light-guiding layer increases in a direction from said light-emitting layer to said transparent electrode.

7. The semiconductor laser device according to claim 5, wherein said light-guiding layer is made of a semiconductor doped with Mg.

8. The semiconductor laser device according to claim 1, wherein said light-emitting layer is made of a compound semiconductor including nitrogen.

9. The semiconductor laser device according to claim 1, wherein said first dielectric is one of $SiO_2$, SiN, $Nb_2O_5$, $ZrO_2$ and $Ta_2O_5$.

10. The semiconductor laser device according to claim 1, wherein said transparent electrode includes Ni.

* * * * *